United States Patent [19]

Machida et al.

[11] Patent Number: 4,583,838

[45] Date of Patent: Apr. 22, 1986

[54] PRINTING APPARATUS

[75] Inventors: Yoshihiro Machida, Joyo; Isamu Itoi, Kyoto; Seigo Imai, Hirakata; Kozo Inui, Suita, all of Japan

[73] Assignee: Dainippon Screen Mfg. Co., Ltd., Kyoto, Japan

[21] Appl. No.: 620,115

[22] Filed: Jun. 13, 1984

[30] Foreign Application Priority Data

Jun. 29, 1983 [JP] Japan ................... 58-119228

[51] Int. Cl.⁴ .............................................. G03B 27/06
[52] U.S. Cl. ...................................... 355/102; 355/85
[58] Field of Search ................ 355/85, 86, 87, 91, 355/99, 102, 103; 414/416

[56] References Cited

U.S. PATENT DOCUMENTS 4,033,695  7/1977  Sader et al. ............................ 355/87
4,362,454  12/1982  Kripzak ................................. 414/416

Primary Examiner—L. T. Hix
Assistant Examiner—Brian W. Brown
Attorney, Agent, or Firm—Brumbaugh, Graves, Donohue & Raymond

[57] ABSTRACT

A printing apparatus including at least one pallet for accommodating an original film and a mask film, at least one pallet for accommodating a spent original film and spent mask film, at least one pallet for accommodating each one of the sizes of the sensitive sheets, a pair of guide rails provided among a pallet for temporarily storing the sensitive sheet, the pallets being movable between a waiting position and a drawn position right above the exposure section provided adjacent to the waiting position by engagement between a pair of guide members mounted on each pallet and the guide rails, a pallet shifting mechanism for the reciprocating movement of each pallet between the waiting position and the drawn position along with the guide rail, and a carrier having suckers mounted on a movable plate thereof and for the reciprocating movement between the waiting position and the drawn position as well as for the vertical movement between a path for the reciprocating movement and an upper side of the exposure section.

4 Claims, 4 Drawing Figures

PRINTING APPARATUS

BACKGROUND OF THE INVENTION

This invention relates to an apparatus for printing an image of an original film on a photosensitive material used in the printing process of a press plate, for example in which the image is printed on a sensitive sheet having a photosensitizer applied thereto.

It is well-known that when an image of the original film is printed on the sensitive sheet in a photomechanical process, the printing operation to be carried out is different depending upon the type of sensitive sheet used.

It is more often than not that when a positive-type sensitive sheet is used wherein a non-exposed area thereof comes to be an image through the developing process, a mask for shading only an image area of the original film (hereinafter called as "image erasing mask") is put in contact with the sensitive sheet in place of the original film after printing the image of the original film, and then the exposure process is carried out. An image erasing mask is also used in a color printing process in which some letters or characters are printed with mono color on the outer space of a color picture area. In such a case, when a positive-type sensitive sheet is used, the original film for characters (hereinafter called "character film") is put in contact with the sensitive sheet together with the image erasing mask superposed thereon, and then the printing operation is carried out.

When a negative-type sensitive sheet is used, wherein the exposed area thereof comes to be an image through the developing process, it is necessary to put another mask for shading only the non-image area of the original film (hereinafter called "cut mask") in contact with the sensitive sheet together with the original film before carrying out the exposure process. The cut mask is also generally used when it is necessary to print some characters on the negative-type sensitive sheet in addition to the pattern of the original film. In such a case, a cut mask incorporating characters therein can be used. In view of the requirement for high quality, however, it is preferred that after printing the pattern of the original film, shading, except the character area, is put in contact with the sensitive sheet in place of the original film before carrying out the exposure.

Recently, most photomechanical processes have become increasingly automated. However, in order to meet the requirement for a high degree of accuracy which needs various complicated operations corresponding to the kind or type of sensitive sheet and to the necessity of the character printing in the course of the printing operation, a certain amount of manual operation still seems to be indispensable and actually does not go out of use. Thus there remains an important subject of further automation of the printing operation in the aspects of labor saving in the whole photomechanical process and speedup thereof.

SUMMARY OF THE INVENTION

Therefore, it is an object of the present invention to provide an automatic printing apparatus which accomplishes an accurate and speedy printing irrespective of the type of sensitive sheet and of the necessity for character printing. More particularly, this invention contemplates an automatic printing apparatus wherein various kinds of complicated printing operations such as image erasing printing, character printing, etc., which have inevitably required some manual processes in the prior art, are automatically processed in an accurate and speedy manner, thereby contributing to labor saving and the speeding up of the photomechanical process as a whole.

Thus, in accordance with this invention, there is provided a printing apparatus comprising at least one pallet for accommodating an original film (including a character film) and a mask together or separately, at least one pallet for accommodating a spent original film (including a character film) and a spent mask, at least one pallet for each of the sensitive sheets for separately accommodating each of the sensitive sheets divided into each size corresponding to the original film, a guide rail provided along a pallet for temporarily storing the sensitive sheet, a waiting position of said pallets and a drawn position of a pallet right above the exposure section provided adjacent to the waiting position, and which is engaged with a guide member mounted on each of said pallets, a pallet shifting mechanism for the reciprocating movement of each said pallet in a selective manner between the waiting position and the drawn position along said guide rail, and a carrier having suckers mounted on a movable plate thereof and for the reciprocating movement above, between the waiting position and the drawn position as well as for the vertical movement between a path for the reciprocating movement and an upper side of said exposure section.

BRIEF DESCRIPTION OF THE DRAWINGS

In the accompanying drawings forming a part of this application, in which like parts are designated with the same reference numerals or characters.

DESCRIPTION OF THE PREFERRED EMBODIMENTS

Referring now to the accompanying drawings, some embodiments in accordance with this invention are described hereinafter. In the first embodiment, the original films, the character plates and the masks are fed from one feed pallet and delivered to one collection pallet.

Figure 1:
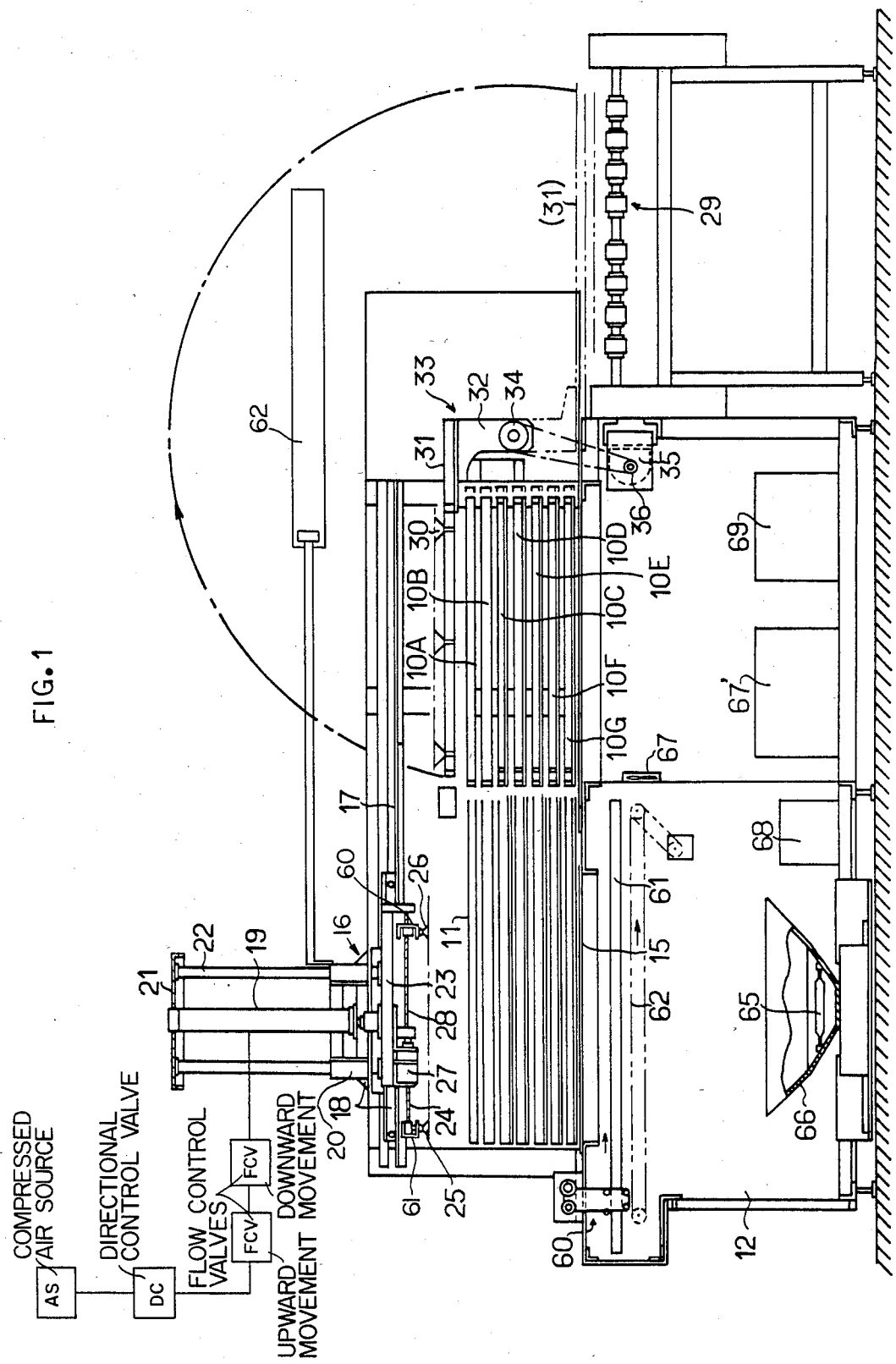
FIG. 1 is a side view illustrating a printing apparatus embodying this invention with its side plate uncovered.
Figure 2:
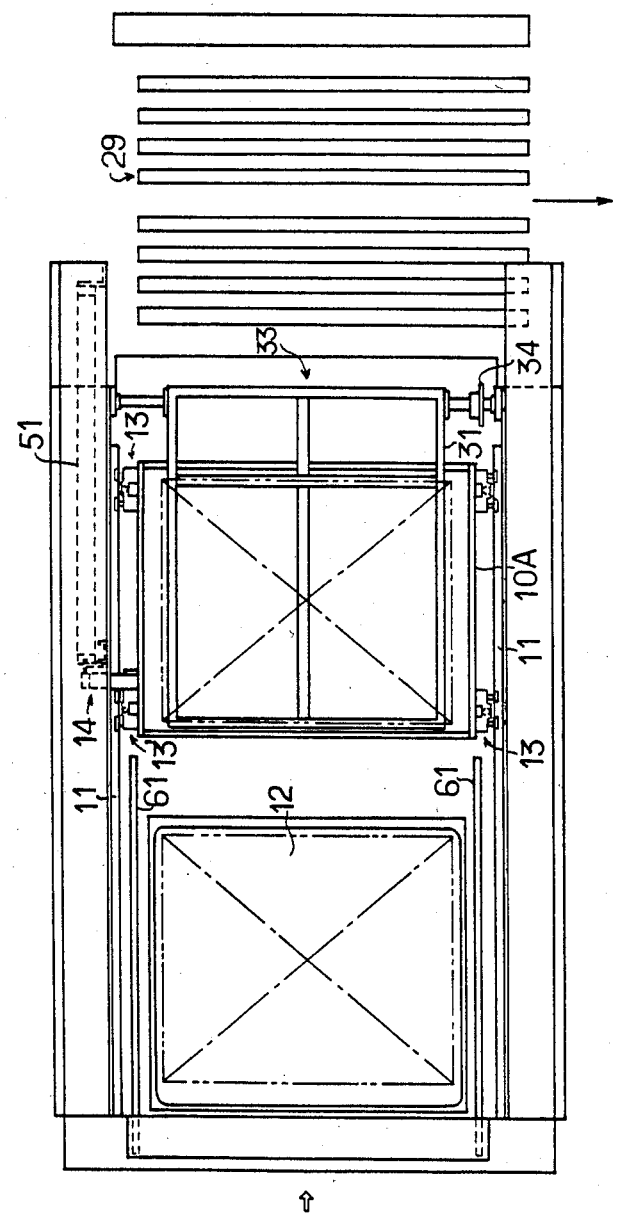
FIG. 2 is a plan view illustrating the positional relation of the substantial parts of the apparatus.

A multiple stage pallet 10 (seven stages in this embodiment) situated in the waiting position illustrated in the center of FIGS. 1 and 2 comprises, from the top thereof, a sensitive sheet storage pallet 10A for temporarily storing or keeping the sensitive sheet, a mask storage pallet 10B for temporarily storing the mask, a collection pallet 10C for accommodating the spent original films and the spent masks, a feed pallet 10D for accommodating the original films and the masks stacked in order of use, and pallets 10E, 10F, 10G for separately accommodating the sensitive sheets of different size classified corresponding to the original film, and each pallet being engaged with a plurality of guide rails 11 through guide members 13, 13' described hereunder. The guide rails 11 are horizontally disposed between said waiting position of the pallet 10 and a drawn position thereof right above an exposure section 12 provided adjacent to the waiting position. Not only the feed pallet 10D illustrated in FIG. 3 but also the other pallets are provided with guide members 13, 13' at the corners of the panel frame. Each of the guide members 13, 13' comprises a pair of guide rollers using ball bearings running on the upper surface of the guide rails 11. The guide rollers also using ball bearings running on the inner side of the guide rails 11, and brackets for keeping the guide rollers horizontal or perpendicular. The guide members 13' are provided with connecting members 14 engaged with a pallet shifting mechanism 45 described hereinafter. By means of this pallet shifting mechanism 45, any of the pallets 10A to 10G is selected and moved in the manner of reciprocating motion along with the rails 11 between the waiting position and the drawn position.

A carrier 16 takes out an object such as original film from the feed pallet 10D, for example, drawing by means of the pallet shifting mechanism 45, and sets the object to a transparent glass plate 15 provided on the exposure section 12. Said carrier 16 comprises a truck 18 running in the same manner as the pallets 10A to 10G slidably along guide rails 17 by means of an air cylinder 62, said guide rails 17 being provided above and in parallel with the guide rails 18, guide sleeve 20 fixed to each of the four corners of the truck (18) of the air cylinder 19, four guide rods 22 slidably associated with the guide sleeve 20 and connected to one another at their respective upper ends through a plate 21, a movable plate 23 connected with a working rod of the air cylinder 19 and with the guide rods 22. Said movable plate 23 is horizontally provided with a pair of supporting rods 24 through a bracket fixed thereto. A plurality of suckers 25 (nine pieces in this embodiment) are fixed to a holding bar 60 corresponding to the positions indicated by a dashed line, said holding bar being orthogonally fixed to the supporting rods 24. Each of said supporting rods 24 is provided with another holding bar 61 which is orthogonal and slidably associated therewith. A plurality of suckers 26 are mounted on said another holding bar in similar locations as said suckers 25. The holding bar on which the suckers 26 are mounted is connected with a small gear motor 27 fixed to the movable plate 23 in the midpoint of said pair of supporting rods 24, and is screw-threaded for engagement with a feed screw 28 rotatably supported by a bearing stand attached to the movable plate 23. Thus the positions held by the suckers 26 are adjustable by means of the feed screw 28 while driving the gear motor 27. The rods 24 pass through the other holding bar 61 so as to keep from turning when the screw 28 is turned. Only a portion of rod 24 is shown in FIG. 1 so that screw 28 is visible.

The air cylinder 19 is of a single-acting type in which a drawing-in operation of the working rod, i.e., the lifting operation of the movable plate 23, is carried out by compressed air being supplied through a directional control valve and a flow-control valve, while drawing-out thereof, i.e. the lowering operation of the movable plate 23 is carried out in the manner of natural lowering down by the dead weight of the movable plate 23, the guide rods 22, etc. to which the working rod actuates when the compressed air inside the cylinder has been discharged through the flow-control valve and the directional control valve. The lowering speed of the movable plate 23 is kept appropriate by the opening of said flow-control valve. In said lifting and lowering operation, the movable plate 23 moves up and down together with the guide rods 23 held by the sleeves 20, thereby the movable plate 23 is lifted and lowered exactly along with the axis of the air cylinder 19 without deviation in the lengthwise direction as well as in the crosswise direction. The stroke of the working rod of the air cylinder 19 is so assured that the suckers 25, 26 arranged in their respective positions as illustrated come sufficiently in contact with the upper face of the transparent glass plate 15 provided on the upper part of the exposure section 12. As a matter of course, there is provided a through hole in the center of the connecting plate 21 so as not to interfere with the air cylinder 19.

A reverse carrying mechanism 33 is provided between the waiting position of the pallet and a discharging belt conveyor 29 is provided adjacent to the waiting position and on the opposite side of the exposure section 12. By means of said reverse carrying mechanism 33, a framework 31 having a sucker is fixed to each of left and right turning arms 32 in the manner of a cantilever. Journals are respectively fixed to each of the turning arms 32, and any of the journals being rotatably supported on the bearing fixed to the frame. A sprocket wheel 34 is fixed to one of said journals, and an endless chain is applied over between said sprocket wheel 34 and another sprocket wheel 36 fixed to an output shaft of a gear motor 35 fixed to the frame, said gear motor 35 having a braking device. Accordingly, by driving the gear motor 35, the turning arms 32 are turned clockwise, the framework 31 being turned along with the arrow (FIG. 1), the exposed sheet (indicated by the two-dot chain line) being reversed so as to come to the position right above the discharging conveyor 29 for the delivery thereof. In this connection, when the framework 31 is situated at the waiting position of the pallet or right above the discharging 29, in order to always keep a horizontal attitude, the stopping position of the arms 32 is controlled by the actuation of a limit switch (not illustrated) which stops the revolution of the gear motor 35 having a braking device when contacting the framework 31. The discharging belt conveyor 29 is connected with a processing apparatus such as a film processor (not illustrated) in the direction of the arrow of FIG. 2.

Referring now to the pallet shifting mechanism 45 each of the guide members 13' of the pallets 10A to 10G is equipped with a connecting member 14 engaged with the pallet shifting mechanism 45. The connecting member 14 comprises an arm 40 fixed to a bracket of said guide member 13', and a roller 41 fixed to a bent end of the arm 40, said roller 41 having a ball bearing. Thus, the pallet shifting mechanism 45 comprises a supporting plate 48 fixed to each of guide blocks 47 slidably associated with each of guide pipes 46 fixed to the frame in parallel with each other in the horizontal direction, a screw bar 49 slidably supported through ball bearings included in each of brackets respectively mounted on both of the upper end and the lower end of said supporting plate 48, a connecting nut 50 screw-threaded for engagement with said screw bar 49, an air cylinder 51 (shown in FIG. 2) both ends of which are fixed to the frame, and a connecting block 53 connected with a working rod 52 of said air cylinder 51 and fixed to the supporting plate 48. A toothed wheel 54 is fixed to the upper part of the screw bar 49 and a toothed wheel 56 to the output shaft of a pulse motor 55 respectively, and a timing belt is applied over between these wheels 54, 56. The pulse motor 55 is fixed to the upper guide block 47 through the supporting frame.

The connecting nut 50 has a -shaped cross section on the side facing to the connecting member 14 so as to be engaged with the roller 41.

Figure 4:
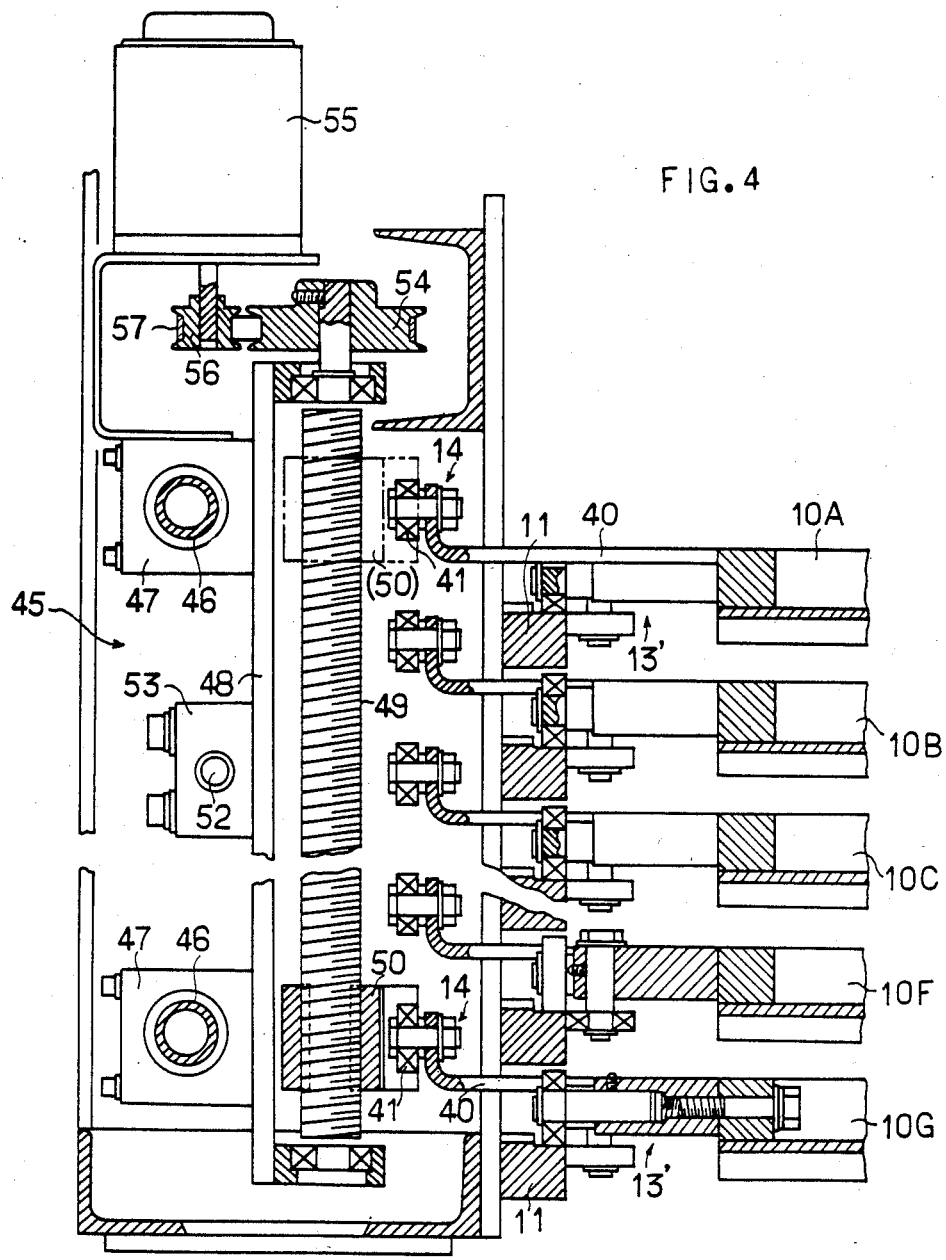
FIG. 4 is a front view illustrating a pallet shifting mechanism partially in section.

In FIG. 4 the pallets 10D, 10E are omitted because of the same structure as the other pallets illustrated.

The original film set onto the transparent glass plate 15 of the exposure section 12 and the sensitive sheet superposed thereon are further covered by a rubber sheet, and the residual air therebetween is eliminated by means of vacuum suction, thereby the original plate and the sensitive sheet are tightly contacted to the glass plate 15. To that effect, there is provided a rubber sheet carrier 60 in which a rubber sheet having a little wider width than the glass plate 15 is taken up by a hollow shaft in the form of a loop, one end of the rubber sheet being fixed to the frame. Said rubber sheet and a squeeze roll of which a rotatable shaft is supported to be slidable in the vertical direction are kept by a pair of supporting plates moving along with a pair of rails 61. A lower end of one of said supporting plates is connected with an endless chain 62 driven by a motor. In this manner, when said endless chain 62 runs in the direction of the arrow (FIG. 1), the rubber sheet carrier 60 moves in the direction of the arrow feeding the rubber sheet, and the squeeze roll following said carrier 60 and coming in contact with a plate cam at the position passing a register pin studded on the glass plate 15, thus the carrier 60 being lowered by the actuation of said plate cam and the dead weight and running while pressing the rubber sheet. When said endless chain is travelled in the reverse direction, the rubber sheet is automatically rolled in by the torque actuated thereto from a flat spiral spring included in said hollow shaft, thereby being stripped off or separated from the glass plate 15.

At the center bottom part of the exposure section 12, such a light source as mercury lamp (metal halide lamp) 65 of instant start, and emitting an intensive blue light or an ultraviolet light, is mounted on the inside of the exposure section 12, and an exhaust fan 67 is mounted on the external wall of the exposure section 12 to discharge hot air from inside thereof. In this connection, 67' is a stabilizer of the mercury lamp 65, 68 is a vacuum pump for the suckers 25, 26, 30 and for the vacuum adhesion of the original film and the sensitive sheet, and 69 is a compressor for feeding the compressed air to the air cylinders 19, 51.

Figure 3:
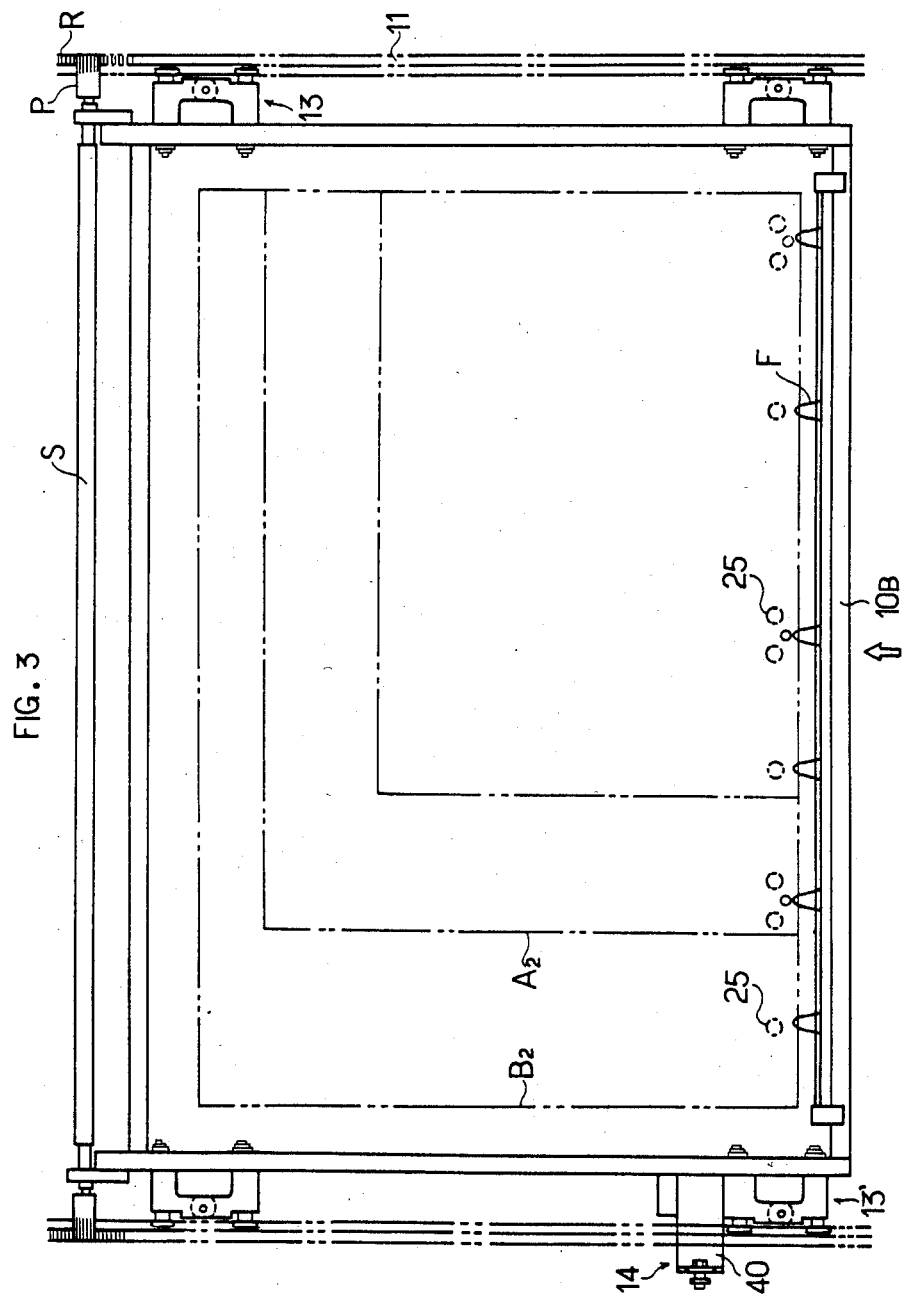
FIG. 3 is a plan view of one example of a pallet.

Referring now to the actuation of the apparatus embodying this invention, the original films and the mask films superposed on the original film as the case may be, are stacked on the feed pallet 10D in order of use by fitting register pins studded on the pallet in the reference punched holes provided on the original films and the mask films and by making even the right end thereof (seen from the operation side indicated by the arrow of FIG. 3). Meanwhile the sensitive sheet is accommodated in the pallets 10E, 10F, 10G by fitting the register pins in the punched holes provided on the respective sensitive sheet according to such sizes as A1, B2, A2, etc. in the same manner as the foregoing original films and the mask films.

Now one example of exposure using the image erasing mask is described hereunder, wherein a single image of the original films having one of four separate colors of cyan, magenta, yellow and black respectively is printed on a positive-type sensitive sheet of size A2, and as to the black, a character film is printed, and further, said image erasing mask is applied commonly in said four colors being used for the exposure process.

In the first place, the feed pallet 10D is drawn to its drawn position by means of the pallet shifting mechanism 45. In this step, a connecting nut 50 indicated by the two-dot chain line of FIG. 4 and which is engaged with the connecting member 14 of the pallet 10A is lowered along with the screw bar 49 by rotating the pulse motor 55 as many as predetermined number of pulses in a direction so as to be engaged wth the connecting member 14 of the pallet 10D. Then the air cylinder 51 is started, the working rod 52 being extruded, the mechanism 45 being moved along with the guide pipes 46, thereby the pallet 10D being drawn to the drawn position. Positioning thereof is performed by the contact of the casing of the pallet 10D with a stopper (not illustrated).

In the foregoing step, as the pallet 10D is shifted through the connecting member 14 fixed to one side thereof, if there should be a small gap between the rail 11 and the guide rollers mounted on the guide memers 13, 13' to run in contact with the inner surface of the rail 11, a slight or microscopic snaking may occur resulting in the deviation of the register pin's location on the pallet 10D. In order to prevent such deviation, a through shaft S having pinions P fixed to both ends thereof is mounted on the side frame with the bearing space minimized so that every pinion P engages with racks R respectively mounted on the upper outside of the rails 11.

Then, the cyan original film of size A2 is taken out of the pallet 10D drawn exactly to its drawn position by means of the carrier 16. In this step, the suckers 25 located at left end are kept from the actuation thereof as shown in FIG. 3, while the positions held by the suckers 26 are adjusted to the size A2. The compressed air inside the air cylinder 19 is discharged as described above, the movable plate 23 is naturaly lowered at an appropriate speed, and the suckers 25, 26 are put in contact with the original film A2 to suctionally stick thereto. Then the compressed air is fed to the air cylinder 19, and the working rod is withdrawn so as to hold the original film A2 suctionally by the suckers 25, 26 in such a manner as indicated by the two-dot chain line.

Then, after returning the pallet 10D to the waiting position, the movable plate 23 is lowered while the compressed air inside the air cylinder 19 is discharged, the original film A2 is set onto the transparent glass plate 15 when the suckers 25,26 are released, and the movable plate 23 is returned by the actuation of the air cylinder 19.

In this step, as the punched holes of the original plate engage with the register pins studded on the glass plate 15, the original film A2 is exactly set to the glass plate 15.

In order to make sure of the exact setting, however, it is preferred to check the setting at the moment when the register pins are half-engaged with the punched holes of the original film or the sensitive sheet while interrupting the discharge of the compressed air and temporarily stopping the lowering.

Then, one of the pallets such as pallet 10G in which the sensitive sheet of A2 is accommodated is exactly superposed on the original film A2 already set onto the glass plate 15 by the same operation as the foregoing performed by the pallet shifting mechanism 45 and by the carrier 16. The rubber sheet is then stretched onto the original film and the superposed sensitive sheet by means of the rubber sheet carrier 60, and the residual air between the rubber sheet and the glass plate 15 is exhausted by the vacuum suction, thereby the original film and the sensitive sheet are tightly contacted to the glass plate 15. Then the mercury lamp 65 is lighted and the exposure is carried out for a suitable period of time (40 seconds for example), thus completing the printing operation.

After completing the foregoing process, the rubber sheet carrier 60 is returned to the position indicated in FIG. 1 so that the rubber sheet is taken off, at this moment the vacuum is released.

Then the movable plate 23 of the carrier 16 is lowered, and the exposed sensitive sheet is suctionally held by the suckers 25, 26 and separated from the original film to be kept at the position of FIG. 1. The sensitive sheet storage pallet 10A is drawn from the waiting position to the drawn position as above-described by means of the pallet shifting mechanism 45. By lowering the movable platet 23 the sensitive sheet held by the suckers 25,26 is put on the storage pallet 10A to be accommodated therein by releasing the vacuum. In this step, the sensitive sheet is exactly positioned by means of the register pins or the like provided in the storage pallet 10A. Then the movable plate 23 is returned to the position of FIG. 1, while the storage pallet 10A is returned to the waiting position thereof by means of the pallet shifting mechanism 45.

The movable plate 23 is then lowered, and after the spent original film is suctionally held by the suckers 25, 26, the movable plate 23 is lifted to be returned to the position of FIG. 1.

The collection pallet 10C is drawn from the waiting position to the drawn position by means of the pallet shifting mechanism 45. And the movable plate 23 is lowered, the spent original film is placed on the collection pallet 10C to be accommodated therein by releasing the vacuum. After that the movable plate 23 is returned to the position of FIG. 1, while the collection pallet 10C is returned to its waiting position by the pallet shifting mechanism 45.

Now the feed pallet 10D is drawn from the waiting position to the drawn position by the pallet shifting mechanism 45 in the preceeding manner, and the mask film as the image erasing mask used commonly for said four colors is drawn from the feed pallet 10D by means of the carier 16 so as to be set onto the transparent glass plate 15 in the same manner as the original film. After returning the pallet 10D to the waiting position, the sensitive sheet storage pallet 10A is now drawn from the waiting position to the drawn position, and the sensitive sheet temporarily stored in the sensitive sheet storage pallet 10A is exactly superposed on the mask film already set onto the glass plate 15 by means of the carrier 16, then the printing is carried out in the same manner as above.

The movable plate 23 of the carrier 16 is then lowered, and the spent sensitive sheet is suctionally held by the suckers 25, 26 and separated from the mask film to be kept at the position of FIG. 1. By actuating the air cylinder 62 connected with the truck 18 of the carrier 16, the carrier 16 moves to the waiting position of the pallets, and after releasing the vacuum in the suckers 25, 26, the exposed sensitive sheet held thereby is now caught by the sucker 30 mounted on the rotatable framework 31 of the reverse carrying mechanism 33 to be delivered thereto.

Then the framework 31 is turned in the direction of the arrow and the exposed sensitive sheet is carried right above the discharging belt conveyor 29 in the reverse manner. The vacuum in the sucker 30 is then released, and the sensitive sheet is delivered to the belt conveyor 29 to be discharged in the direction of the arrow indicated in FIG. 2. In case a processing apparatus is provided in connection with the discharging belt conveyor 29, it is preferred to synchronize the discharging speed with the conveying speed of the processor. Since the sensitive sheet is set in such manner that the surface to which a photosensitive material is applied comes in contact with the original film, when delivering the sensitive sheet reversely to the discharging belt conveyor 29, the surface to which some emulsion is applied is prevented from direct contact with the belt, thereby damage is sufficiently prevented during carrying to the developing apparatus.

While the exposed sensitive sheet is delivered to the discharging belt conveyor 29 by means of the reverse carrying mechanism 33, the carrier 16 is returned to the position of FIG. 1, the movable plate 23 is lowered, and after the mask film is suctionally caught by the suckers 25, 26, the movable plate 23 is lifted to be returned to the position of FIG. 1. The storage pallet 10B is now drawn to the drawn position, and the movable plate 23 is lowered to accommodate the mask film in said pallet 10B. In this step, the mask film is exactly positioned by means of the register pins or the like mounted on the storage pallet 10B. The mask film is temporarily stored in the storage pallet 10B as mentioned because the same mask film is also applied to the other plates having the same image of magenta, yellow and black respectively. When said image erasing mask is applied to the plates of said magenta, yellow and black, the mask film is taken out of the mask storage pallet 10B as a matter of course, being different from the printing process of the cyan original plate in which the mask film is taken out of the feed pallet 10D.

Thus the printing process of the original film as well as said masking is completed.

Almost the same operation as the foregoing is to be carried out also in case of the magenta or yellow original film, the details of which are omitted here to simplify the description.

Referring now to the black original film, the same operation as cyan, magenta and yellow plates is carried out. After completing the printing process of the original film, the sensitive sheet is delivered to the sensitive sheet storage pallet 10A and the original film to the collection pallet 10D. The mask film is then taken out of the mask storage pallet 10B to be set onto the transparent glass plate 15, the character film being taken out of the feed pallet 10D to be set onto the mask film, and finally the sensitive sheet on which the image of the original film has been printed is taken out of the sensitive sheet storage pallet 10A to be set onto the character plate. After completing said step, the rubber sheet is stretched over the mask film, the character film and the sensitive sheet superposed on one another as described above, thus the printing being carried out.

After said printing operation, the sensitive sheet is delivered to the discharging belt conveyor 29 by means of the reverse carrying mechanism 33, and the character film and the mask film to the collection pallet 10C. When the same mask film is further required for the subsequent printing, the mask film is temporarily stored in the mask storage pallet 10B, and when not required for the subsequent printing, the mask film is delivered to the collection pallet 10C.

Although one example wherein the characters are printed on the black plate is described in the foregoing description, printing on the different color plate is also available as a matter of course.

By the foregoing series of operations, one cycle of the four color printing as well as masking are completed. In this connection, it is also possible to print consecutively the image of four color plates and then to carry out four sequences of masking corresponding to four such colors. More particularly, the original film and the sensitive sheet are fed respectively onto the glass plate 15 to be printed, the sensitive sheet being stored in the sensitive sheet storage pallet 10A, and the original film being delivered to the collection pallet 10C, thus repeating said process with respect to each of the four colors in order.

In this case, the mask storage pallet 10B is unnecessary since the mask film can be kept while setting onto the glass plate 15 during the four times of masking.

Also in said case, if it is necessary to print not only the black original film but also the characters on the sensitive sheet, the character film is to be set before setting the sensitive sheet when carrying out the masking.

Referring now to the printing on the negative-type sensitive sheet, in the first place the cut mask is taken out of the feed pallet 10D to be set onto the glass plate 15, and the original film is also taken out of the feed pallet 10D to be set onto said cut mask. Then the sensitive sheet is taken out from one of the pallets for accommodating the sensitive sheet such as the pallet 10G to be set onto the cut mask, the original film already being set onto the glass plate 15. After carrying out the exposure, the sensitive sheet is delivered to the belt conveyor 29 and the original film to the collection pallet 10C, respectively. Thus the foregoing operation is repeated with respect to every four color original film, while keeping the cut mask set onto the glass plate 15 until all the four color printing is completed. When it is necessary to print characters, the sensitive sheet is temporarily stored in the sensitive sheet storage pallet 10A after completing the printing of the black original film, the character film is set onto the glass plate 15 after delivering the original film and the cut mask to the collection pallet 10C, and the sensitive sheet taken out of the storage pallet 10A being set onto the character film for the printing.

Although the original film, the character film and the mask film are fed exclusively from the feed pallet 10D and delivered exclusively to the collection pallet 10C in the foregoing description, it is also possible to provide a pallet individually for each of the original film, the character film and the mask film.

The printing order of cyan-magenta-yellow-black is changeable at one's option as a matter of course.

It is further possible to stock temporarily the exposed sensitive sheet for the convenience of developing so as to be processed by a batch method. In this case, any one pallet of the sensitive sheet pallets 10E to 10G can be used for the stock.

Now, when the original sheet or the sensitive sheet is taken out of the pallets 10C to 10G being suctionally caught by the suckers 25, 26, it should be assured not to take out more than one sheet at a time. For that purpose, the suckers 25, 25 are operated in the selective manner as above-described corresponding to each size of the original film and the sensitive sheet, and furthermore, as illustrated in FIG. 3, there are provided thin flat springs F on the operation side (indicated by the arrow) of each of the pallets 10C to 10G through the supporting bar in such manner that each end of the springs F which are evenly arranged comes slightly in contact with the original film or the sensitive sheet, and said flat springs F are put in contact with the original sheet or the sensitive sheet by the spring tension so as to give a light shock thereto, thereby the second sheet once taken out together with the first one is separated therefrom even if more than one sheet should be taken out.

As a matter of course, said series of operations such as selection of pallet, feed, delivery, discharge, storage, vacuum suction, exposure, etc. of sensitive sheet, original sheet, mask film, etc., can be controlled by means of NC or based on adequate programs stored in some microcomputer corresponding to the order of the operations.

It will be evident to those skilled in the art that this invention is not limited to the details of the foregoing illustrative embodiments, and that this invention may be embodied in other specific forms without departing from the essential attributes thereof, and it is therefore desired that the foregoing embodiments be considered in all respects as illustrative and not restrictive, reference being made to the appended claims rather than the foregoing description, and all changes which come with the meaning and the range of equivalency of the claims are therefore to be embraced therein.

What is claimed is:

1. A printing apparatus for printing an original film on a photosensitive material, comprising: an exposure section; a first pallet for feeding the original film, said first pallet being formed so as to preliminarily accommodate the original film and a mask film in a superposed manner; at least one second pallet provided and formed so as to accommodate a sensitive sheet of a certain size; a third pallet provided so as to collect and accommodate a spent original film and a spent mask film; a fourth pallet for temporarily storing the sensitive sheet, said pallets being movable between a waiting position and a drawn position in which the pallet is above said exposure section and adjacent said waiting position; a pair of guide members mounted on each of said pallets; a pair of guide rails provided between said waiting position and said drawn position of said pallets, said pair of guide rails being engageable with said pallet guide members; a pallet shifting mechanism for selectively moving each of said pallets along said guide rails in a reciprocative manner between said waiting position and said drawn position; and carrier means including a movable plate having suckers for assisting in said reciprocative movement of said pallets, said carrier means also providing vertical movement between a path for said reciprocative movement and an upper side of said exposure section.

2. A printing apparatus as defined in claim 1; and further comprising at least one more second pallet for accommodating a sensitive sheet of a different size.

3. A printing apparatus as defined in claim 1; and further comprising a fifth pallet provided so as to temporarily store the mask film.

4. A printing apparatus as defined in claim 1 or claim 3; and further comprising belt conveyor means for discharging an exposed sensitive sheet, said conveyor means being provided adjacent to said waiting position of said pallets, and a reverse carrying mechanism including a rotatable frame having suckers mounted thereon, said reverse carrying mechanism connecting said carrier means with said conveyor means.

* * * * *